(12) United States Patent
Liu

(10) Patent No.: US 10,852,343 B2
(45) Date of Patent: Dec. 1, 2020

(54) NOISE MEASUREMENT SYSTEM

(71) Applicant: ProPlus Design Solutions, Inc., San Jose, CA (US)

(72) Inventor: Zhihong Liu, Cupertino, CA (US)

(73) Assignee: PROPLUS ELECTRONICS CO., LTD., Jinan (CN)

( * ) Notice: Subject to any disclaimer, the term of this patent is extended or adjusted under 35 U.S.C. 154(b) by 160 days.

(21) Appl. No.: 16/234,202

(22) Filed: Dec. 27, 2018

(65) Prior Publication Data

US 2020/0209303 A1    Jul. 2, 2020

(51) Int. Cl.
*G01R 31/00* (2006.01)
*G01R 31/26* (2020.01)
*G01R 1/18* (2006.01)
*G01R 31/28* (2006.01)
*G01R 1/04* (2006.01)

(52) U.S. Cl.
CPC ........... *G01R 31/2616* (2013.01); *G01R 1/04* (2013.01); *G01R 1/18* (2013.01); *G01R 31/002* (2013.01); *G01R 31/2886* (2013.01); *G01R 31/2887* (2013.01); *G01R 31/2889* (2013.01); *G01R 31/286* (2013.01); *G01R 31/2808* (2013.01)

(58) Field of Classification Search
CPC .. G01R 1/18; G01R 31/2886; G01R 31/2889; G01R 1/04; G01R 31/002; G01R 31/2887; G01R 31/2808; G01R 31/286

USPC ......... 324/71, 378, 403, 415, 425, 500, 537, 324/750.26, 750.27
See application file for complete search history.

(56) References Cited

U.S. PATENT DOCUMENTS

| | | | |
|---|---|---|---|
| 2009/0160464 A1* | 6/2009 | Lane | G01R 27/205 324/715 |
| 2010/0164519 A1* | 7/2010 | Sellathamby | G01R 1/07307 324/756.03 |
| 2018/0180662 A1* | 6/2018 | Liu | G01R 31/2646 |

* cited by examiner

*Primary Examiner* — Raul J Rios Russo
(74) *Attorney, Agent, or Firm* — Thomas C. Chan; Silicon Valley Patent Group LLP

(57) ABSTRACT

Apparatuses of a noise measurement system and methods for using the same are disclosed. In one embodiment, a noise measurement system may include a plurality of probe groups electrically coupled to a plurality of DUTs, where a probe group in the plurality of probe groups includes multiple channels, and where the multiple channels of each probe group are bundled as a group for reducing electromagnetic interference among the plurality of probe groups, and wherein the group is shielded from corresponding signal groups of other DUTs with a connection to a circuit ground of the noise measurement system for reducing ground loop generated signal interference. The noise measurement system may further include a controller configured to perform noise measurement.

19 Claims, 10 Drawing Sheets

NOISE MEASUREMENT SYSTEM

FIELD

The present disclosure relates to the field of semiconductor design for yield equipment. In particular, the present disclosure relates to apparatuses of a noise measurement system and methods for using the same.

BACKGROUND

Flicker noise, also known as 1/f noise, is an important characteristic for various semiconductor devices, such as MOSFETs, BJTs, JFETs, Diode, and integrated circuit (IC) resistors. Not only does it directly impact the circuit performance of modern ICs, but it also has been used as an important technique to characterize the manufacturing process quality. On-wafer noise measurement has been done more often in massive volume by semiconductor foundries. SPICE models are built, even with statistical corners, to be distributed to circuit designers to assist them to accurately analyze the impact of noise to circuit performance, especially to radio frequency, low noise, and high-sensitive devices. Accurately measuring noise at wafer level is challenging and time consuming, mostly due to the noisy probing environment, accurate DC bias requirement, and complicated cable connections. Comparing noise measurements of multiple devices under tests (DUTs) can be even more challenging.

FIG. 7 illustrates a convention approach for performing noise measurement. In the approach shown in FIG. 7, $DUT_0$, $DUT_1$ to $DUT_N$ are the devices under tests. For accurate noise measurements, co-axial cables (represented by the ovals/circles) are used to shield each of the wires that transmit signals to or receive signals from the terminals of the DUTs. The co-axial cables are connected to a circuit ground for shielding electromagnetic interferences. Each grounding of the cable introduces a grounding resistance, which is generally represented as Rg. A person skilled in the art would understand that the resistance of Rg can vary depending on the operating frequency of a particular DUT. In addition, in conventional approaches, the grounding of the cables are distributed, based on the location of the circuit ground terminal and the circuit ground plane. Moreover, the circuit ground terminals of the DUTs may be coupled together before connecting them to a circuit ground of the noise measurement system. There are a number of drawbacks in the conventional approach shown in FIG. 7.

One drawback is that each of the grounding resistance Rg can increase as the operating frequency of the DUT, which in turn introduces a voltage drop across each of the Rg and therefore adversely affects the accuracy of the conventional noise measurement system. Another drawback of the conventional approach is that when the circuit ground terminal of the DUTs are connected together, it further introduces resistance, shown as $R_0$, $R_1$ to $R_N$, which creates a means to allow the operations of one DUT to affect the operations of its neighboring DUTs. For example, when one DUT oscillates, it may cause its neighboring DUTs to oscillate, which in turn can adversely affect the accuracy of the conventional noise measurement system.

Therefore, it is desirable to address the issues of the conventional noise measurement system.

SUMMARY

Apparatuses of a noise measurement system and methods for using the same are disclosed. In one embodiment, a noise measurement system may include a plurality of probe groups electrically coupled to a plurality of DUTs, where a probe group in the plurality of probe groups includes multiple channels, and where the multiple channels of each probe group are bundled as a group for reducing electromagnetic interference among the plurality of probe groups, and wherein the group is shielded from corresponding signal groups of other DUTs with a connection to a circuit ground of the noise measurement system for reducing ground loop generated signal interference. The noise measurement system may further include a controller configured to perform noise measurement of the plurality of DUTs through the plurality of probe groups using programmable testing parameters.

In another embodiment, a method of performing noise measurement in a noise measurement system may include coupling a plurality of probe groups electrically to a plurality of DUTs, where a probe group in the plurality of probe groups includes multiple channels, bundling the multiple channels of each probe group as a group for reducing electromagnetic interference among the plurality of probe groups, shielding the group from corresponding signal groups of other DUTs with a connection to a circuit ground of the noise measurement system for reducing ground loop generated signal interference, performing, by a controller, noise measurement of the plurality of DUTs through the plurality of probe groups using programmable testing parameters.

BRIEF DESCRIPTION OF THE DRAWINGS

The aforementioned features and advantages of the disclosure, as well as additional features and advantages thereof, will be more clearly understandable after reading detailed descriptions of embodiments of the disclosure in conjunction with the non-limiting and non-exhaustive aspects of following drawings. Like numbers are used throughout the figures.

DESCRIPTION OF EMBODIMENTS

Embodiments of apparatuses of a noise measurement system and methods for using the same are disclosed. The following descriptions are presented to enable any person skilled in the art to make and use the disclosure. Descriptions of specific embodiments and applications are provided only as examples. Various modifications and combinations of the examples described herein will be readily apparent to those skilled in the art, and the general principles defined herein may be applied to other examples and applications without departing from the scope of the disclosure. Thus, the present disclosure is not intended to be limited to the examples described and shown, but is to be accorded the widest scope consistent with the principles and features disclosed herein. The word "exemplary" or "example" is used herein to mean "serving as an example, instance, or illustration." Any aspect or embodiment described herein as "exemplary" or as an "example" in not necessarily to be construed as preferred or advantageous over other aspects or embodiments.

Figure 1:
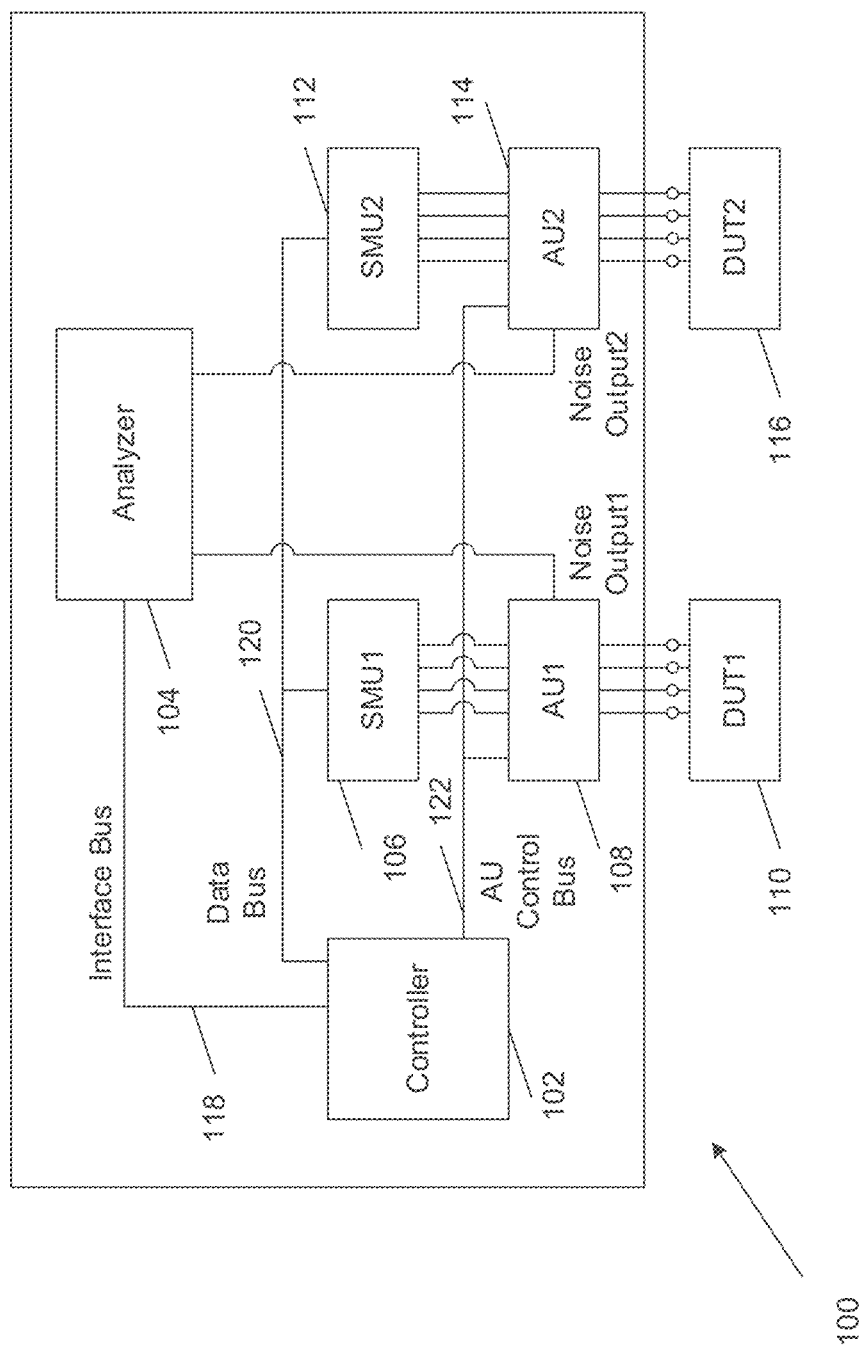
FIG. 1 illustrates an exemplary noise measurement system according to aspects of the present disclosure.

FIG. 1 illustrates an exemplary noise measurement system according to aspects of the present disclosure. In the example shown in FIG. 1, the noise measurement system 100 includes controller 102, analyzer 104 and two noise measurement channels. The first noise measurement channel includes source measurement unit 1 (SMU1) 106, amplifier unit 1 (AU 1) 108, which are controlled by controller 102 to perform noise measurements on device under test 1 (DUT 1) 110. The second noise measurement channel includes source measurement unit 2 (SMU2) 112, amplifier unit 2 (AU 2) 114, which are controlled by controller 102 to perform noise measurements on device under test 2 (DUT 2) 116. The controller 102 communicates with and controls the analyzer 104 via an interface bus 118; communicates with and controls SMU1 and SMU2 via a data bus 120; and communicates with and controls AU1 and AU2 via AU control bus 122. The noise output 1 from DUT 1 is communicated to the Analyzer 104 via AU1; and the noise output 2 from DUT 2 is communicated to the Analyzer 104 via AU2. Examples of detail implementations and operations of a noise measurement channel is further described below in association with FIG. 3, FIG. 4A and FIG. 4B. The controller 102, analyzer 104 and the noise measurement channels can be configured to perform the methods described in FIG. 5, and FIG. 7 through FIG. 10.

In some embodiments, the controller 102 can be configured to set up each channel of the noise measurement system 100 in substantially the same manner Operations of both channel 1 and channel 2 can be synchronized. For example, the noise measurement operations in both channel 1 and channel 2 can be synchronized to start at the same time within a predetermined margin of deviation/error. In addition, the control of SMU1 106 and SMU2 112 as well as the control of AU1 108 and AU2 114 by the controller 102 can be synchronized. In this configuration, the noise measurement channels may be setup in parallel and triggered in a synchronized manner.

According to aspects of the present disclosure, the noise measurement system 100 employs a common data acquisition approach, which can be synchronized in data recordation and acquisition to ensure data from the different channels are collected at the same time within a programmable margin of error tolerance. The synchronized approach of data recordation and acquisition can enable efficient data analysis and identification of device local variations caused by manufacturing process variations, common mode interferences caused by variations of testing environment, and correlations of testing parameters.

Figure 2:
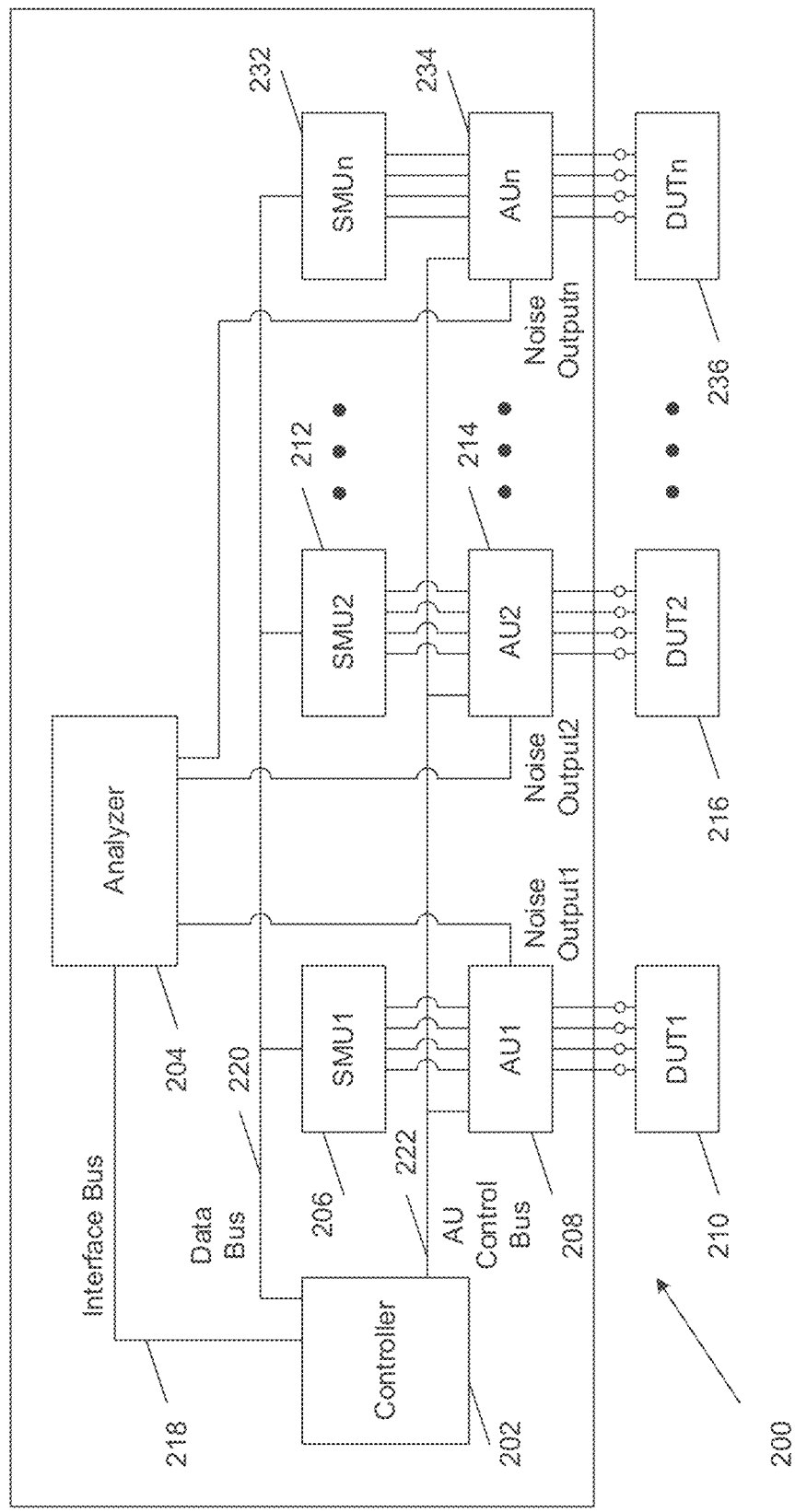
FIG. 2 illustrates another exemplary noise measurement system according to aspects of the present disclosure.

FIG. 2 illustrates another exemplary noise measurement system according to aspects of the present disclosure. As shown in FIG. 2, the noise measurement system 200 expands the noise measurement system 100 of FIG. 1 to include additional noise measurement channels.

The noise measurement system 200 includes controller 202, analyzer 204 and multiple noise measurement channels. The first noise measurement channel includes source measurement unit 1 (SMU1) 206, amplifier unit 1 (AU 1) 208, which are controlled by controller 202 to perform noise measurements on device under test 1 (DUT 1) 210. The second noise measurement channel includes source measurement unit 2 (SMU2) 212, amplifier unit 2 (AU 2) 214, which are controlled by controller 202 to perform noise measurements on device under test 2 (DUT 2) 216. The $n^{th}$ noise measurement channel includes source measurement unit n (SMUn) 232, amplifier unit n (AUn) 234, which are controlled by controller 202 to perform noise measurements on device under test n (DUTn) 236. Note that number of noise measurement channels, represented by n, may be based on particular noise measurement test design and performance requirements. In general, the number of noise measurement channels may be programmable.

The controller 202 communicates with and controls the analyzer 204 via an interface bus 218; communicates with and controls SMU1 206 through SMUn 232 via a data bus 220; and communicates with and controls AU1 208 through AUn 234 via AU control bus 222. The noise output 1 from DUT 1 210 is communicated to the Analyzer 204 via AU1 208; the noise output 2 from DUT 2 216 is communicated to the Analyzer 104 via AU2 214; and the noise output n from DUT n 236 is communicated to the Analyzer 104 via AUn 234. Examples of detail implementations and operations of a noise measurement channel is further described below in association with FIG. 3, FIG. 4A and FIG. 4B. The controller 202, analyzer 204 and the noise measurement channels can be configured to perform the methods described in FIG. 5, and FIG. 7 through FIG. 10.

According to aspects of the present disclosure, the controller 202 can be configured to set up each channel of the noise measurement system 200 in substantially the same manner Operations of channel 1 through channel n can be synchronized. For example, the noise measurement operations in channel 1 through channel n can be synchronized to start at the same time, within a predetermined margin of error tolerance. In addition, the control of SMU1 206 through SMUn 232 as well as the control of AU1 208 through AUn 234 by the controller 202 can be synchronized. In this configuration, the noise measurement channels may be setup in parallel and triggered in a synchronized manner.

According to aspects of the present disclosure, the noise measurement tests of each channel may be conducted under substantially the same measurement conditions, such as the same temperature and lighting. In addition, each DUT may be set up with substantially the same bias conditions, load and input resistors, filter time constants, etc. Upon setting up the multiple measurement channels, the controller 202 may then check the stability of the setup to determine whether the noise measurement process is ready to start. Then the controller 202 may then start the noise measurement operations in a synchronized manner.

Figure 3:
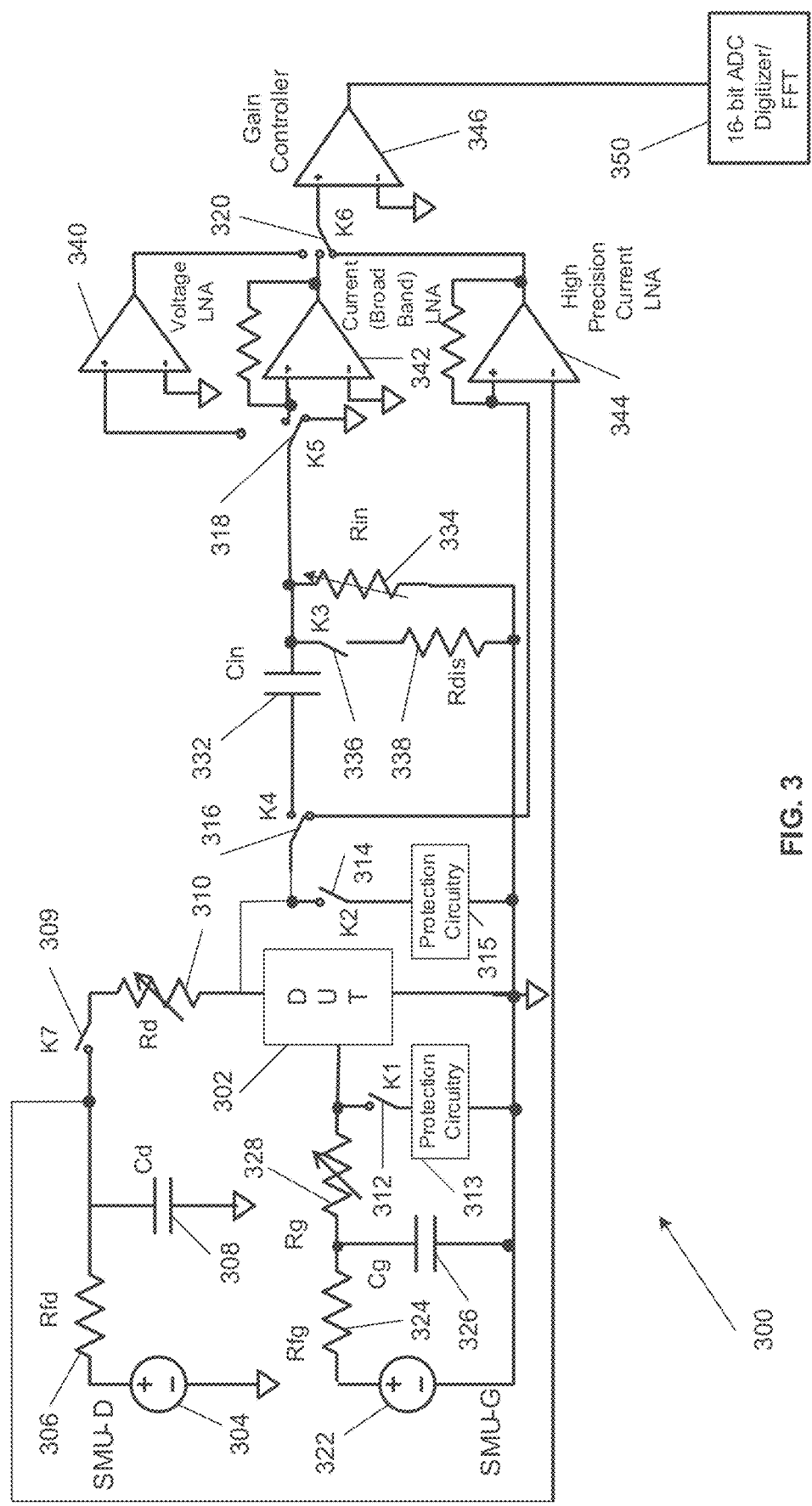
FIG. 3 illustrates an exemplary implementation of one channel of a noise measurement system according to aspects of the present disclosure.

FIG. 3 illustrates an exemplary implementation of one channel of a noise measurement system according to aspects of the present disclosure. In the exemplary implementation shown in FIG. 3, noise measurements of a device under test (DUT) 302 can be performed by the noise measurement apparatus 300. A first circuit path of the noise measurement apparatus 300 may include a first source measurement unit 304 (SMU-D), resister 306 (Rfd), capacitor 308 (Cd), programmable switch 309 (K7), and variable resister 310 (Rd) coupled to a first terminal of the DUT 302. A second circuit path of the noise measurement apparatus 300 may include a third source measurement unit 322, resister 324 (Rfg) and capacitor 326 (Cg), as well as variable resistor 328 (Rg) coupled to a second terminal of the DUT 302. A decoupling circuit of the noise measurement apparatus 300 may include capacitor 332 (Cin), variable resistor 334 (Rin), as well as programmable switch 336 (K3) and resistor 338 (Rdis) in parallel with variable resistor 334 (Rin), which are configured to decouple the DUT 302 and the amplification circuit of the noise measurement apparatus 300. In the particular embodiment shown in FIG. 3, the amplification circuit may include a voltage LNA 340, a broadband current LNA 342, a high precision current LNA 344, and a gain controller 346. The noise measurement apparatus 300 may further include ADC digitizer or FFT 350.

According to embodiments of the present disclosure, charge built-up (Vd) at the output terminal (also referred to as the first terminal) of the DUT 302 may be discharged through the control of programmable switch 314 (K2), protection circuitry 315, and programmable switch 316 (K4). For example, when K2 is closed and K4 is open, the charge at the output terminal may be discharged to the circuit ground through K2 and protection circuitry 315. In some implementations, it is desirable to discharge the output terminal of the DUT 302 before discharging the second terminal of the DUT 302 via the programmable switch 312 (K1) and protection circuitry 313. Similar to the description in FIG. 2, for discharging capacitor 332 (Cin), charges may be discharged through resistor 334 (Rin). To shorten the discharging time, charges in capacitor 332 (Cin) may be discharged through resistor 338 (Rdis) with programmable switch 336 (K3) being closed.

Programmable switch 318 (K5) and programmable switch 320 (K6) may be configured to enable the noise measurement apparatus 300 to adjust input impedance of the amplification circuit based on the output signal characteristics of the DUT 302. In a particular embodiment, the noise measurement apparatus 300 may be configured to select a first amplifier in a plurality of amplifiers of the amplification circuit (for example select voltage LNA 340) to be used to measure the noise based on the output signal characteristics of the DUT 302. In addition, the noise measurement apparatus 300 may be configured to detect changes in the output signal characteristics of the DUT 302, select a second amplifier (for example select high precision current LNA 344) in the plurality of amplifiers to measure the noise based on the changes in the output signal characteristics of the DUT 302, and transition from the first amplifier (e.g. voltage LNA 340) to the second amplifier (e.g. high precision current LNA 344) to measure the noise of the DUT 302.

In a particular embodiment of the noise measurement apparatus 300, the decoupling circuit may be bypassed by controlling programmable switch 316 to direct output signals of the DUT 302 to an input of the amplification circuit, for example to a first input of the high precision current LNA 344, directly. A second input of the current LNA 344 may be received from the first circuit path by controlling programmable switch 309 (K7).

According to aspects of the present disclosure, a noise measurement apparatus may include a low-noise pre-amplifier to amplify the device under test (DUT) noise signal, a dynamic signal analyzer to capture the noise time-domain data and convert them into frequency domain noise data through FFT, and a DC bias system to provide proper biases to DUT. In one approach, battery may be used to bias DUT as it can be sufficiently noise free. However, battery may be difficult to maintain and adapt to the required bias conditions. In an alternative approach, a programmable DC bias supply may be used. In this alternative approach, programmable source measurement units (SMUs) may be employed to bias and measure the current of DUT. Since the SMUs may not be 'quiet' enough for noise measurement, filters may be employed to clean up the residual noises from the DC bias.

Figure 4A:
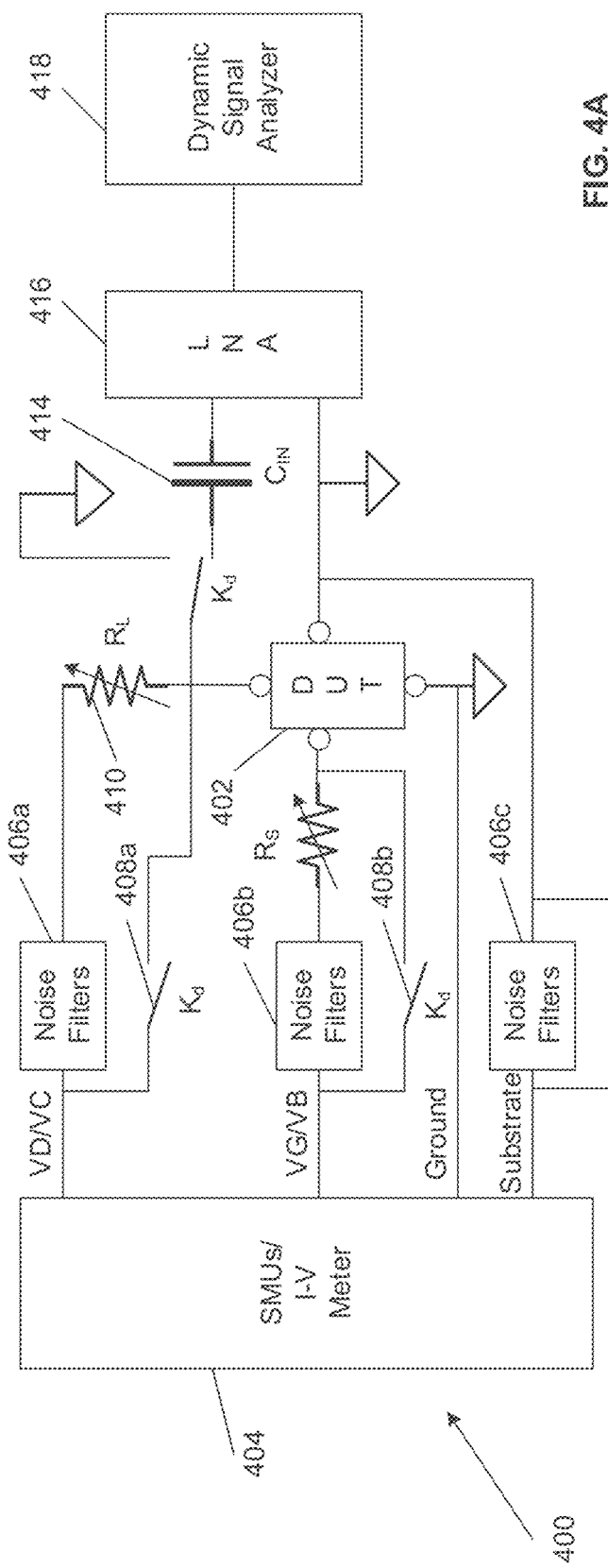
FIG. 4A illustrates another exemplary implementation of one channel of a noise measurement system according to aspects of the present disclosure.

FIG. 4A illustrates another exemplary implementation of one channel of a noise measurement system according to aspects of the present disclosure. In this example, it shows a diagram of a noise measurement apparatus 400 for MOSFETs or BJT devices, such as DUT 402. The noise measurement apparatus 400 may include one or more SMUs 404 (or I-V meter) to drive each of the first, second, third, and fourth circuit paths, where each of the circuit paths is coupled to a terminal of the DUT 402. Each of the circuit paths may include one or more noise filters (406a, 406b, and 406c), except the third circuit path, which is the circuit ground. The one or more noise filters may be bypassed by programmable switches (408a, 408b, and 408c), respectively.

In addition to the components listed above, the noise measurement apparatus 400 may include a load variable resistor 410 ($R_L$), an input variable resistor 412 ($R_S$) and a decoupling capacitor 414 ($C_{in}$), which decouples the DUT 402 from low noise amplifier(s) 416. The output of the LNA 416 may be analyzed by a dynamic signal analyzer 418. Programmable switches 408a, 408b, and 408c (Kd) are used to switch between noise and DC measurements. Such a system can be controlled so that the selection of measurement modes, resistors, biases, and filter time constants can be programmable.

Figure 4B:
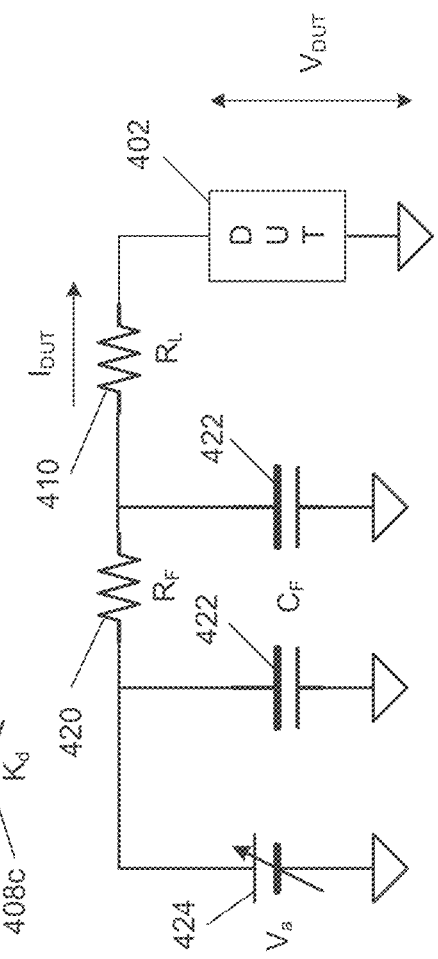
FIG. 4B illustrates an exemplary drain direct current biasing circuit of FIG. 4A according to aspects of the present disclosure.

FIG. 4B illustrates an exemplary drain direct current biasing circuit of FIG. 4A according to aspects of the present disclosure. As shown in FIG. 4B, a diagram that shows the simplified drain DC biasing circuit of FIG. 4A. The bias filter includes resistor 420 ($R_F$) and capacitors 422 ($C_F$). If the leakage current of the filter capacitor is negligible, the DUT bias voltage $V_{dut}$ can be written as $$V_{dut}=V_a-I_{dut}(R_F+R_L), \quad (1)$$

where $R_L$ is the loading resistor, $V_a$ (424) is the output voltage of SMU, and $R_F$ is the filter resistor. To achieve accurate $V_{dut}$, both $I_{dut}$ and $R_F+R_L(=R)$ are desirable be accurate as well. The stabilization of the current $I_{dut}$ may depend on the RC time constant of the filters, while the error of resistance may largely depend on the quality of the resistor and the environment conditions. The total error of $V_{dut}$ can be written as $$\frac{\Delta V_{dut}}{V_{dut}}=-\frac{RI_{dut}}{V_{dut}}\left(\frac{\Delta I_{dut}}{I_{dut}}+\frac{\Delta R}{R}\right), \text{ where, } R=R_L+R_F. \quad (2)$$

The error in $I_{dut}$ may be difficult to mitigate due to the leakage of the filter capacitor (a few tens of nA) and limited charging time in high volume measurement. As a result, a larger value of R (larger $R_L$) can lead to a larger error of $V_{dut}$. A smaller $R_L$ may be chosen to ensure accurate $V_{dut}$. Besides, a shorter filter time constant may be selected as long as the filter low end cut off frequency can be met. To reduce the error induced by the leakage of $C_F$, high quality capacitors may be used.

The filters, $R_L$ and coupling capacitor also determine the time for the system to stable after applying required bias. For efficient measurement, smaller R, smaller $C_F$ and $C_{in}$ may be desired. However, C and R cannot be too small as they may also affect the measurement quality to be discussed in the following sections. The typical time for the system to stabilize after being applied the bias can be between 10 to 100 seconds, mostly depending on the bias condition and measurement accuracy. The overall system stabilization time can be determined by the longest charging time of all the filtered SMU channels. It may take 3-5 τ's (τ=R×C) of the bias system before a reliable noise data can be measured.

According to aspects of the present disclosure, the low noise amplifier in a noise measurement system can be a factor in getting quality data. Both voltage amplifier and current amplifier (a.k.a., trans-conductance amplifier) may be used for low noise measurement. The selection of the amplifiers may depend on the signal nature, and primarily depend on the output impedance of the device under test (DUT). A voltage amplifier can be a better choice for measuring DTU with low output impedance, while a current amplifier can be more suitable for measuring high impedance signals. For example, when measuring MOSFET noise, a current amplifier can be used in sub-threshold and saturation regions where the Rout (1/Gds) may be high, a voltage amplifier can then be chosen for linear (triode) region. Another advantage of using a current amplifier may be its insensitivity to prober noise when doing wafer level measurement due to its low input impedance. Note that the voltage amplifier also has a lower cutoff frequency than the current amplifier when a large $R_L$ is used to measure low level noise. On the other hand, a current amplifier may not work well for low impedance DUT due to its reduced bandwidth and sensitivity. Current amplifiers may also have higher noise at higher frequency as it approaches to the amplifier bandwidth due to LNA parasitic capacitance. In addition to input impedance and bandwidth, LNA noise floor can also be a key consideration. Generally, a voltage LNA can have a lower voltage noise floor, also called input referred noise voltage floor, while a current LNA should have a lower current noise floor. This because that noise voltage can be more sensitive for low impedance DUTs and noise current can be more sensitive for high impedance DUTs.

Figure 5A:
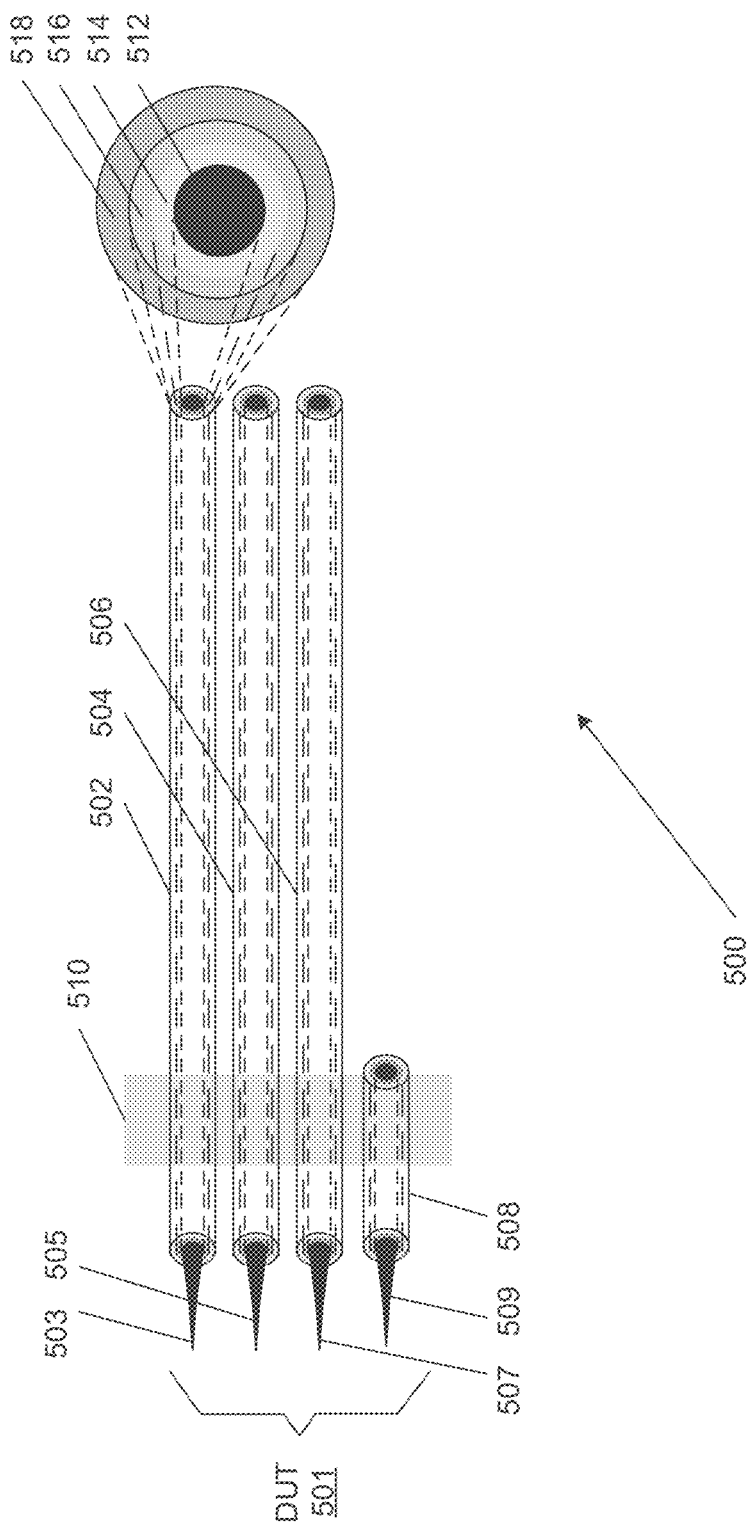
FIG. 5A illustrates an exemplary probe group for performing noise measurement according to aspects of the present disclosure.

FIG. 5A illustrates an exemplary probe group for performing noise measurement according to aspects of the present disclosure. As shown in FIG. 5A, the exemplary probe group 500 may include multiple channels, labelled as 502, 504, 506 and 508 with their corresponding probe tips, namely 503, 505, 507, and 509. Each channel, such as 502, 504 and 506, may be configured to carry an input signal or an output signal to and from DUT 501 (not shown), and 508 is configured to be a circuit ground channel. The probe tips 503, 505, 507, and 509 can be configured to contact the terminals of the DUT 501. The exemplary probe group 500 further includes a circuit ground pad 510. The circuit ground pad is electrically coupled to a circuit ground terminal of the DUT 501 through the circuit ground channel 508 of the probe group 500.

As shown in the enlarged circles of FIG. 5A, each channel of the probe group 500 includes a conductor configured to transmit electrical signals through the channel. An insulation layer 514 configured to provide electrical insulation to the conductor. A metal layer 516 configured to provide shielding of electromagnetic interference noise caused by an electrical current passing through the conductor. A metal oxide layer 518 configured to further reduce emission leak from the electrical signals. In addition, the metal oxide layer 518, also known as the shielding layer, of channels are electrically coupled to the circuit ground pad 510. With this approach, a ground current of DUT 501 may flow through circuit ground channel 508, circuit ground pad 510, and the metal oxide layer 514 of channels 502, 504, and 506 to a circuit ground of the noise measurement system. In some implementations, the metal oxide layer 514 may be made from materials that include at least one of ferrite, manganese oxide or zinc oxide.

According to aspects of the present disclosure, the multiple channels of the probe group 500 are bundled as a group to reduce electromagnetic interference among the plurality of probe groups. In other words, the electromagnetic interference to probe group 500 from other probe groups (not shown) can be mitigated.

Figure 5B:
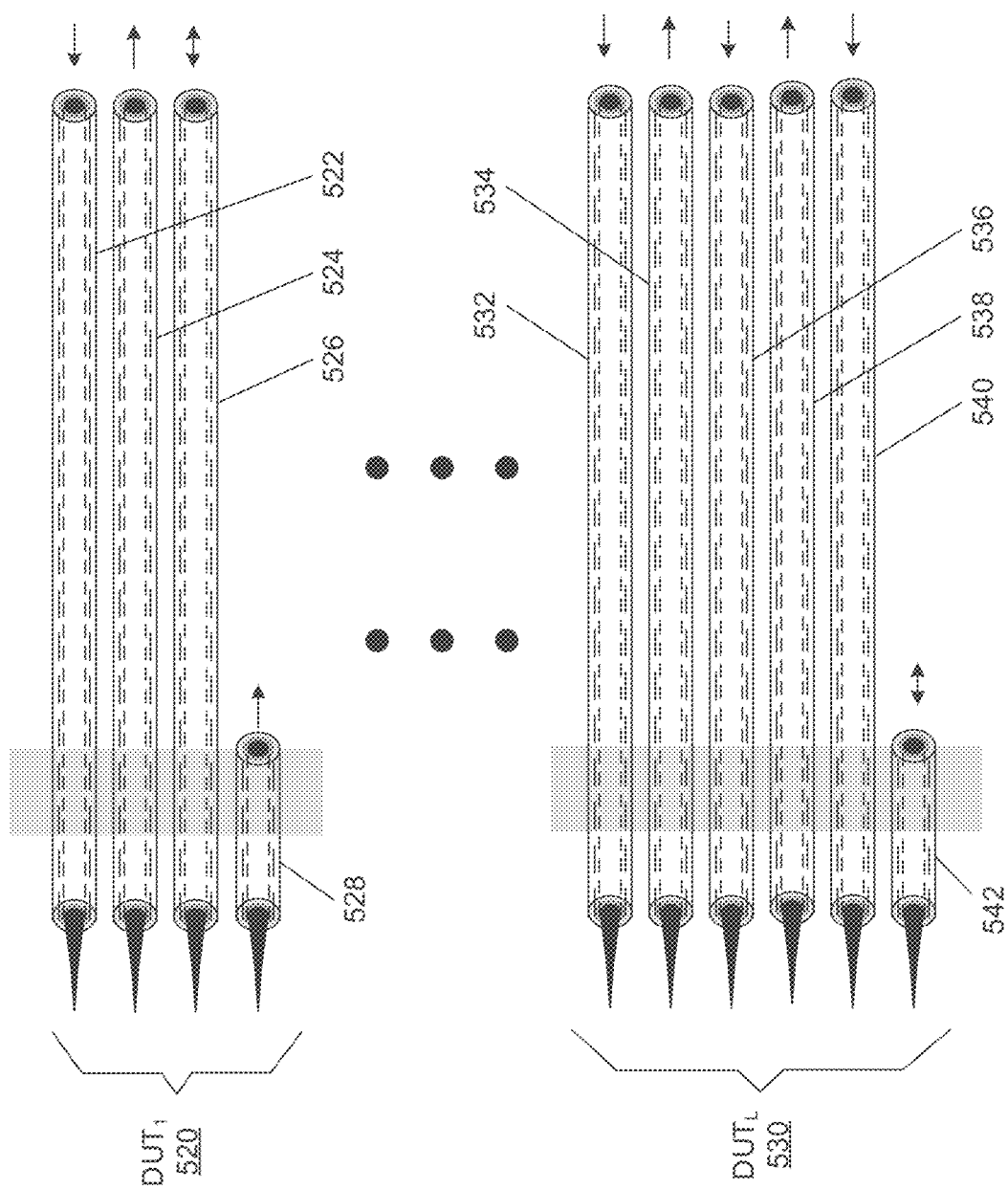
FIG. 5B illustrates a plurality of probe groups for performing parallel noise measurements according to aspects of the present disclosure.

FIG. 5B illustrates a plurality of probe groups for performing parallel noise measurements according to aspects of the present disclosure. In the example shown in FIG. 5B, the plurality of probe groups are listed from $DUT_1$ 520 to $DUT_L$ 530. Each probe group may have different number of channels. For example, $DUT_1$ 520 may have four channels, namely 522, 524, 526, and a circuit ground channel 528. On the other hand, $DUT_L$ 530 may have six channels, namely 532, 534, 536, 538, 540, and a circuit ground channel 542. The material contents of probe groups for $DUT_1$ 520 and $DUT_L$ 530 are similar to the probe group 500 for DUT 501 of FIG. 5A, thus the description of the material contents of the probe groups are skipped for simplicity.

Referring to $DUT_1$ 520, it may include two input channels 522 and 526 (represented by arrows pointing to the left) and an output channel 524 (represented by the arrow pointing to the right). In this particular example, the circuit ground channel 528 shows the current is flowing away from $DUT_1$ 520. For example, to perform noise measurement of a complementary metal-oxide-semiconductor (CMOS) transistor as $DUT_1$ 520, channel 522 may be electrically coupled to the gate terminal, channel 524 may be electrically coupled to the source terminal, channel 526 may be electrically coupled to the drain terminal, and channel 528 may be electrically coupled to the body of the CMOS transistor. In this manner, control signals may be applied to the CMOS transistor, and noise measurement data may be collected from the CMOS transistor. In some implementations, certain channels can be configured to carry input signals and output signals at the same time. For example, channel 526 can be configured to apply bias and measuring output at the same time for $DUT_1$ 520.

Referring to $DUT_L$ 530, it may include two single directional input channels 532 and 536 (represented by arrows pointing to the left) and two single directional output channels 534 and 538 (represented by the arrows pointing to the right). In this particular example, the circuit ground channel 528 shows the current is flowing away from $DUT_1$ 520. In some implementations, certain channels can be configured to carry input signals at one time and carry output signals at another time. In this particular example, the circuit ground channel 542 can be configured to carry current out of the $DUT_L$ 530 at one time and carry current into the $DUT_L$ 530 at another time.

According to aspects of the present disclosure, the multiple channels of the probe group are bundled as a group to maintain a reverse phase among signals of the one or more input channels and signals of the one or more output channels for reducing impedance contributed by conductance or for reducing impedance contributed by inductance of the one or more input channels and the one or more output channels. For example, channel 532 may be configured to carry an input current to $DUT_L$ 530 and channel 534 may be configured to carry a corresponding output current from $DUT_L$ 530. In this scenario, since the time delay passing through the $DUT_L$ 530 can be small, as the input current increases in channel 532, the output current also increases in channel 534. Similarly, as the input current decreases in channel 532, the output current also decreases in channel 534. Thus, the phase of the input-output pair can be substantially similar and they work together to reduce impedance contributed by conductance or to reduce impedance contributed by inductance of the one or more input channels and the one or more output channels.

Figure 5C:
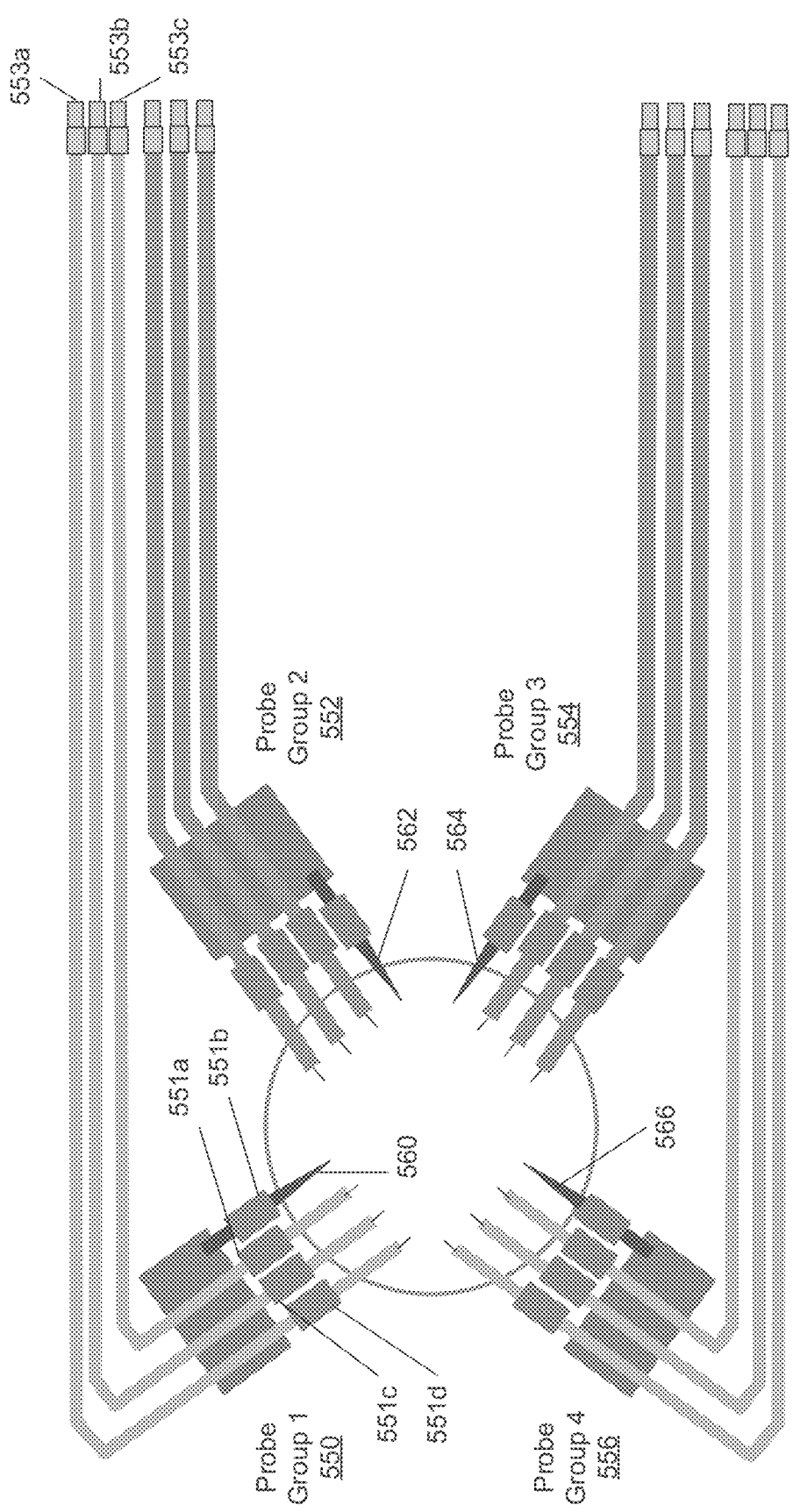
FIG. 5C illustrates another setup of using plurality of probe groups for performing parallel noise measurements according to aspects of the present disclosure.

FIG. 5C illustrates another setup of using plurality of probe groups for performing parallel noise measurements according to aspects of the present disclosure. As shown in FIG. 5C, the noise measurement system uses Probe Group 1 (550), Probe Group 2 (552), Probe Group 3 (554), and Probe Group 4 (556) to perform noise measurements. The material contents of each of Probe Group 1 (550), Probe Group 2 (552), Probe Group 3 (554), and Probe Group 4 (556) are mostly similar to the probe group 500 for DUT 501 of FIG. 5A, thus the description of the similar material contents of these probe groups are skipped for simplicity.

Besides the material contents of the probe group described above, each channel of Probe Group 1 (550), Probe Group 2 (552), Probe Group 3 (554), and Probe Group 4 (556) include an inline ferrite bean that is configured to reduce electromagnetic interferences caused by the current carried in the various channels in each probe group. For example, Probe Group 1 (550) includes ferrite beans 551a, 551b, 551c, and 551d. In addition, each channel of Probe Group 1 (550), Probe Group 2 (552), Group Card 3 (554), and Probe Group 4 (556) include a contact pad that is configured to make electrical contact with the rest of circuitry of the noise measurement system. As shown in FIG. 5C, Probe Group 1 (550) includes contact pads 553a, 553b, and 553c.

Probe Group 2 (552), Probe Group 3 (554), and Probe Group 4 (556) also include a ferrite bean and a contact pad in each channel, and they are not labelled for simplicity.

According to aspects of the present disclosure, by separating the circuit ground channels of the probe groups, namely 560, 562, 564 and 566, the corresponding circuit ground terminals of a DUT (for example corresponding to probe group 1 550, not shown) is decoupled from circuit ground terminals of other DUTs (corresponding to probe group 2 552, probe group 3 554, and probe group 4 556, not shown) in the plurality of DUTs (not shown) to prevent circuit oscillations caused by interactions among the plurality of DUTs of the noise measure system.

Figure 6A:
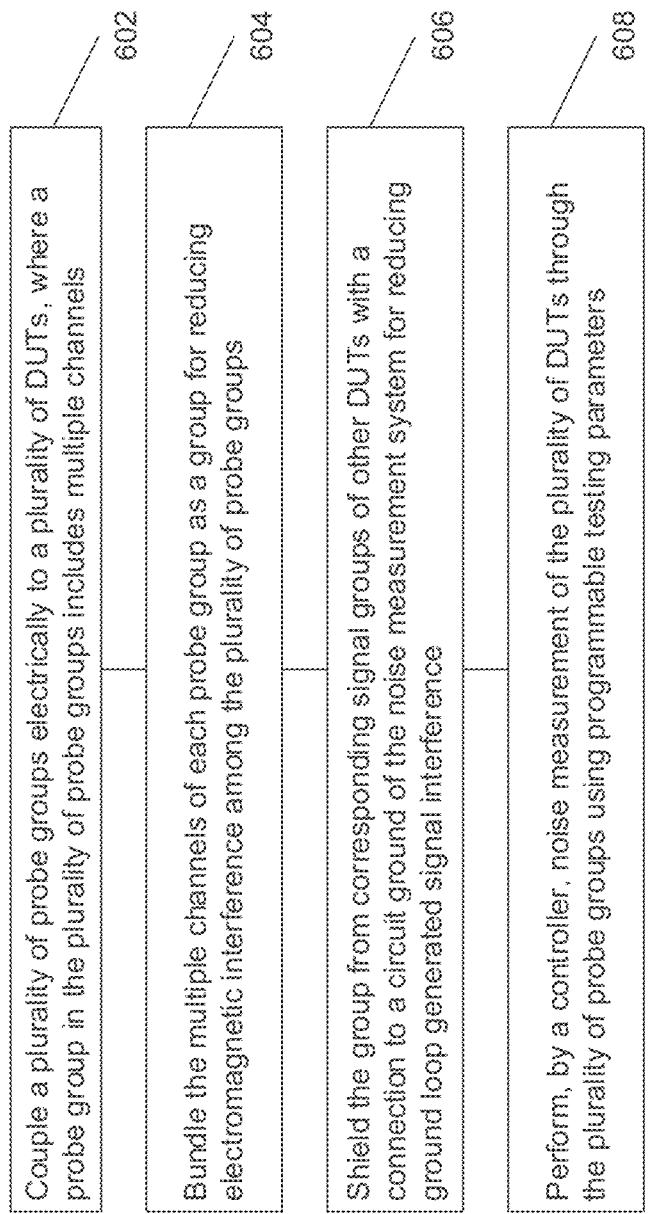
FIG. 6A illustrates an exemplary implementation of performing noise measurement in a noise measurement system according to aspects of the present disclosure.

FIG. 6A illustrates an exemplary implementation of performing noise measurement in a noise measurement system according to aspects of the present disclosure. In the example shown in FIG. 6A, in block 602, the method couples a plurality of probe groups electrically to a plurality of DUTs, where a probe group in the plurality of probe groups includes multiple channels. In block 604, the method bundles the multiple channels of each probe group as a group for reducing electromagnetic interference among the plurality of probe groups. In block 606, the method shields the group from corresponding signal groups of other DUTs with a connection to a circuit ground of the noise measurement system for reducing ground loop generated signal interference. In block 608, the method performs, by a controller, noise measurement of the plurality of DUTs through the plurality of probe groups using programmable testing parameters.

According to aspects of the present disclosure, the multiple channels of the probe group may include one or more input channels, one or more output channels, and a circuit ground channel A DUT in the plurality of DUTs may include an input terminal, an output terminal, and a circuit ground terminal. The probe group may further include a circuit ground pad. The circuit ground terminal of the DUT is coupled to the circuit ground pad through the circuit ground channel of the probe group. The signal ground of the one or more input channels and the one or more output channels are separated to prevent ground loop interference.

In some implementations, a channel in the multiple channels of the probe group may include a conductor configured to transmit electrical signals through the channel, an insulation layer configured to provide electrical insulation to the conductor, and a metal oxide layer configured to provide shielding of electromagnetic interference noise caused by an electrical current passing through the conductor. The metal oxide layer may include at least one of Iron oxide, Manganese oxide or Zinc oxide.]

Figure 6B:
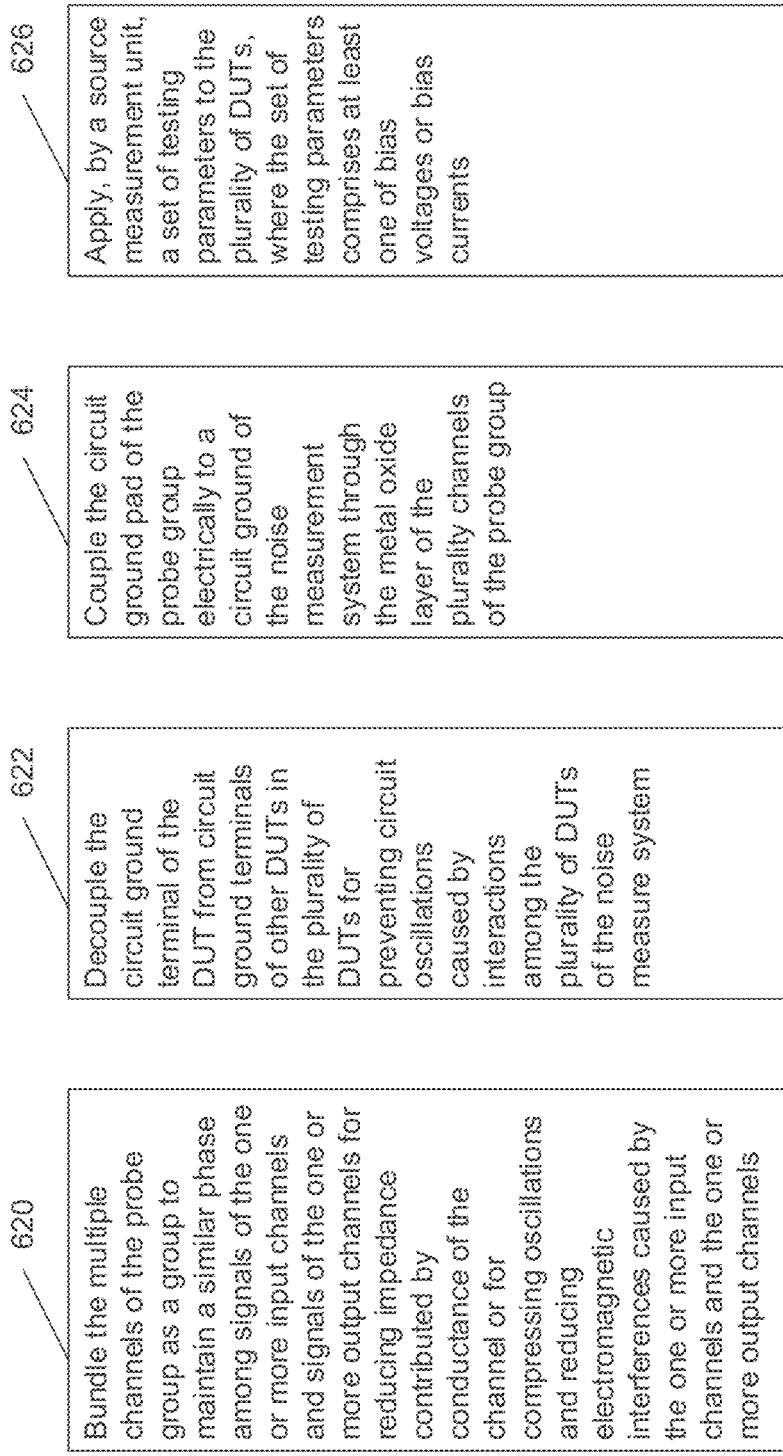
FIG. 6B illustrates additional or optional approaches to the exemplary implementation of FIG. 6A for performing noise measurement in a noise measurement system.
Figure 7:
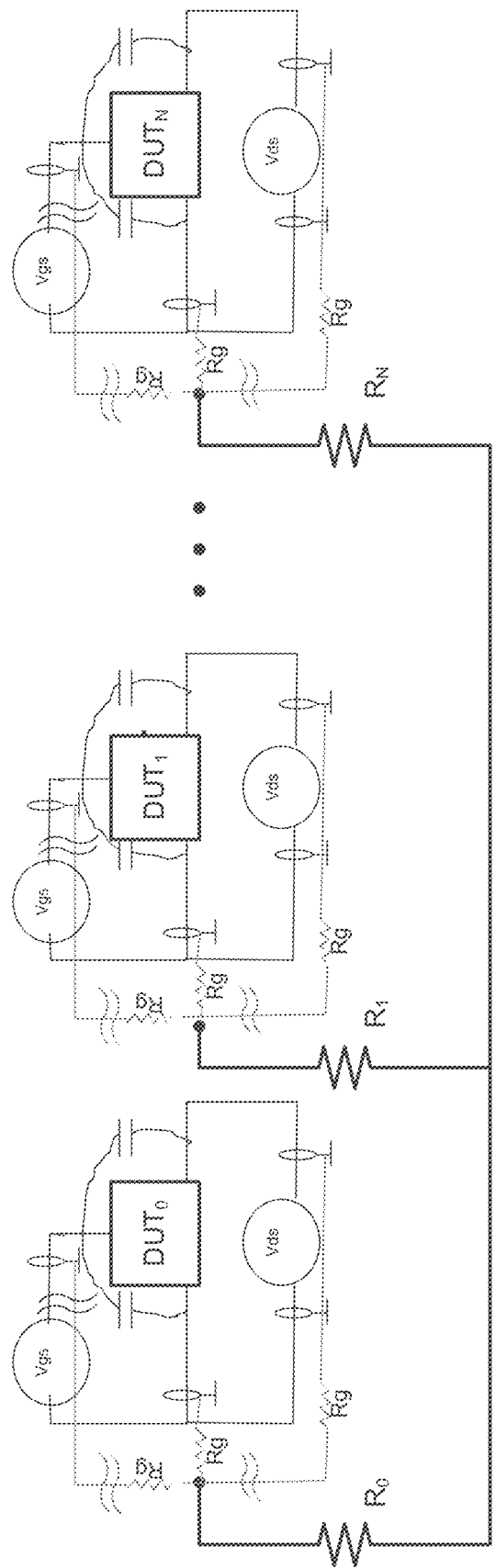
FIG. 7 illustrates a convention approach for performing noise measurement.

FIG. 6B illustrates additional or optional approaches to the exemplary implementation of FIG. 6A for performing noise measurement in a noise measurement system. As shown in FIG. 6B, in block 620, the method bundles the multiple channels of the each probe group as a group to maintain a reverse phase among signals of the one or more input channels and signals of the one or more output channels for compressing oscillations and reducing electromagnetic interferences caused by the one or more input channels and the one or more output channels. Additionally or optionally, the method bundles the multiple channels of the each probe group as a group to maintain a reverse phase among signals of the one or more input channels and signals of the one or more output channels for compressing oscillations and reducing electromagnetic interferences caused by the one or more input channels and the one or more output channels.

In block 622, the method decouples the circuit ground terminal of the DUT from circuit ground terminals of other DUTs in the plurality of DUTs for preventing circuit oscillations caused by interactions among the plurality of DUTs of the noise measure system.

In block 624, the method couples the circuit ground pad of the probe group electrically to a circuit ground of the noise measurement system through the metal oxide layer of the plurality channels of the probe group.

In block 626, the method applies, by a source measurement unit, a set of testing parameters to the plurality of DUTs, where the set of testing parameters comprises at least one of bias voltages or bias currents.

The methodologies described herein may be implemented by various means depending upon applications according to particular examples. For example, such methodologies may be implemented in hardware, firmware, or combinations thereof. In a hardware implementation, for example, a processing unit may be implemented within one or more application specific integrated circuits ("ASICs"), digital signal processors ("DSPs"), digital signal processing devices ("DSPDs"), programmable logic devices ("PLDs"), field programmable gate arrays ("FPGAs"), processors, controllers, micro-controllers, microprocessors, electronic devices, other devices units designed to perform the functions described herein, or combinations thereof.

Some portions of the detailed description included herein are presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining" or the like refer to actions or processes of a specific apparatus, such as a special purpose computer, special purpose computing apparatus or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

The terms, "and," and "or" as used herein may include a variety of meanings that will depend at least in part upon the context in which it is used. Typically, "or" if used to associate a list, such as A, B or C, is intended to mean A, B, and C, here used in the inclusive sense, as well as A, B or C, here used in the exclusive sense. Reference throughout this specification to "one example" or "an example" means that a particular feature, structure, or characteristic described in connection with the example is included in at least one example of claimed subject matter. Thus, the appearances of the phrase "in one example" or "an example" in various places throughout this specification are not necessarily all referring to the same example. Furthermore, the particular features, structures, or characteristics may be combined in one or more examples. Examples described herein may include machines, devices, engines, or apparatuses that operate using digital signals. Such signals may comprise electronic signals, optical signals, electromagnetic signals, or any form of energy that provides information between locations.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

What is claimed is:

1. A noise measurement system, comprising:
   a plurality of probe groups electrically coupled to a plurality of DUTs (devices under test),
      wherein a probe group in the plurality of probe groups includes multiple channels,
      wherein the multiple channels of each probe group are bundled as a group for reducing electromagnetic interference among the plurality of probe groups,
      wherein the group is shielded from corresponding signal groups of other DUTs with a connection to a circuit ground of the noise measurement system for reducing ground loop generated signal interference;
      and a controller configured to perform noise measurement of the plurality of DUTs through the plurality of probe groups using programmable testing parameters.

2. The noise measurement system of claim 1, wherein the multiple channels of the probe group includes one or more input channels, one or more output channels, and a circuit ground channel, and wherein a DUT in the plurality of DUTs includes an input terminal, an output terminal, and a circuit ground terminal, wherein the signal ground of the one or more input channels and the one or more output channels are separated to prevent ground loop interference.

3. The noise measurement system of claim 2, wherein the multiple channels of the probe group are bundled as a group to maintain a reverse phase among signals of the one or more input channels and signals of the one or more output channels for compressing oscillations and reducing electromagnetic interferences caused by the one or more input channels and the one or more output channels.

4. The noise measurement system of claim 2, wherein the probe group further comprises a circuit ground pad, wherein the circuit ground terminal of the DUT is coupled to the circuit ground pad through the circuit ground channel of the probe group.

5. The noise measurement system of claim 4, wherein the circuit ground terminal of the DUT is decoupled from circuit ground terminals of other DUTs in the plurality of DUTs to prevent circuit oscillations caused by interactions among the plurality of DUTs of the noise measure system.

6. The noise measurement system of claim 4, wherein a channel in the multiple channels of the probe group comprises:
   a conductor configured to transmit electrical signals through the channel;
   an insulation layer configured to provide electrical insulation to the conductor;

a metal layer configured to provide shielding of electromagnetic interference noise caused by an electrical current passing through the conductor; and a metal oxide layer configured to further reduce emission leak from the electrical signals.

7. The noise measurement system of claim 6, wherein the circuit ground pad of the probe group is electrically coupled to a circuit ground of the noise measurement system through the metal oxide layer of the plurality channels of the probe group.

8. The noise measurement system of claim 6, wherein the metal oxide layer comprises at least one of ferrite, manganese oxide or zinc oxide.

9. The noise measurement system of claim 1, wherein the controller further comprises:

a source measurement unit configured to control bias conditions of a DUT and provide power to the DUT for noise measurement; and an amplifier unit configured to amplify noise output data received from the DUT.

10. The noise measurement system of claim 9, wherein the controller is further configured to:

apply a set of testing parameters to the plurality of DUTs, wherein the set of testing parameters comprises bias voltages and bias currents.

11. A method of performing noise measurement in a noise measurement system, comprising:

coupling a plurality of probe groups electrically to a plurality of DUTs (devices under test), wherein a probe group in the plurality of probe groups includes multiple channels;

bundling the multiple channels of each probe group as a group for reducing electromagnetic interference among the plurality of probe groups;

shielding the group from corresponding signal groups of other DUTs with a connection to a circuit ground of the noise measurement system for reducing ground loop generated signal interference;

performing, by a controller, noise measurement of the plurality of DUTs through the plurality of probe groups using programmable testing parameters.

12. The method of claim 11, wherein the multiple channels of the probe group includes one or more input channels, one or more output channels, and a circuit ground channel, and wherein a DUT in the plurality of DUTs includes an input terminal, an output terminal, and a circuit ground terminal.

13. The method of claim 12, further comprising:

bundling the multiple channels of the each probe group as a group to maintain a reverse phase among signals of the one or more input channels and signals of the one or more output channels for compressing oscillations and reducing electromagnetic interferences caused by the one or more input channels and the one or more output channels.

14. The method of claim 12, wherein the probe group further comprises a circuit ground pad, wherein the circuit ground terminal of the DUT is coupled to the circuit ground pad through the circuit ground channel of the probe group, wherein the signal ground of the one or more input channels and the one or more output channels are separated to prevent ground loop interference.

15. The method of claim 14, further comprising:

decoupling the circuit ground terminal of the DUT from circuit ground terminals of other DUTs in the plurality of DUTs for preventing circuit oscillations caused by interactions among the plurality of DUTs of the noise measure system.

16. The method of claim 14, wherein a channel in the multiple channels of the probe group comprises:

a conductor configured to transmit electrical signals through the channel;

an insulation layer configured to provide electrical insulation to the conductor;

a metal layer configured to provide shielding of electromagnetic interference noise caused by an electrical current passing through the conductor; and a metal oxide layer configured to further reduce emission leak from the electrical signals.

17. The method of claim 16, further comprising:

coupling the circuit ground pad of the probe group electrically to a circuit ground of the noise measurement system through the metal oxide layer of the plurality channels of the probe group.

18. The method of claim 16, wherein the metal oxide layer comprises at least one of ferrite, manganese oxide or zinc oxide.

19. The method of claim 11, wherein performing noise measurement of the plurality of DUTs through the plurality of probe groups comprises:

applying, by a source measurement unit, a set of testing parameters to the plurality of DUTs, wherein the set of testing parameters comprises at least one of bias voltages or bias currents.

\* \* \* \* \*